United States Patent [19]
Mukerji et al.

[11] Patent Number: 5,183,692
[45] Date of Patent: Feb. 2, 1993

[54] POLYIMIDE COATING HAVING ELECTROLESS METAL PLATE

[75] Inventors: Prosanto K. Mukerji, Schaumburg; Russell Mallen, Glen Ellyn; George Demet, Arlington Heights; Harry Fuerhaupter, Villa Park, all of Ill.

[73] Assignee: Motorola, Inc., Schaumburg, Ill.

[21] Appl. No.: 724,029

[22] Filed: Jul. 1, 1991

[51] Int. Cl.$^5$ .............................................. C23C 26/00
[52] U.S. Cl. .................................. 427/304; 427/305; 427/306; 427/437; 427/438; 427/443.1
[58] Field of Search ............... 427/304, 305, 306, 437, 427/438, 443.1

[56] References Cited

U.S. PATENT DOCUMENTS

| | | |
|---|---|---|
| Re. 29,015 | 10/1976 | DeAngelo . |
| 3,736,170 | 5/1973 | Lo . |
| 3,791,848 | 2/1974 | DeAngelo . |
| 3,821,016 | 6/1974 | DeAngelo . |
| 3,937,857 | 2/1976 | Brummett . |
| 3,954,570 | 5/1976 | Shirk et al. . |
| 4,112,139 | 9/1978 | Shirk et al. . |
| 4,152,195 | 5/1979 | Bahrle ................................. 427/96 |
| 4,528,216 | 7/1985 | Ogura .................................. 427/96 |
| 4,666,735 | 5/1987 | Hoover ................................ 427/98 |
| 4,775,449 | 10/1988 | Dumas et al. . |
| 4,806,395 | 2/1989 | Walsh ................................ 427/307 |
| 4,832,799 | 5/1989 | Knudsen . |
| 4,868,253 | 9/1989 | Hodgson . |
| 4,931,310 | 6/1990 | Anschel ............................. 427/306 |

FOREIGN PATENT DOCUMENTS

| | | |
|---|---|---|
| 990593 | 6/1976 | Canada ............................... 427/306 |
| 187706 | 7/1986 | European Pat. Off. ............ 427/304 |
| 0310803 | 3/1989 | European Pat. Off. . |
| 0329406 | 6/1989 | European Pat. Off. . |

OTHER PUBLICATIONS

Hicks, Robt. E., "Electroplated Funnel Through-Holes on Polyimide Hybrids and Multilayer Circuit Boards", publication name and date uncertain, copy obtained from Chemical Abstracts Service.

*Primary Examiner*—Shrive Beck
*Assistant Examiner*—Vi Duong Dang
*Attorney, Agent, or Firm*—Douglas D. Fekete

[57] ABSTRACT

A method for producing a coating composed of an electroless metal plate, such as a copper plate, tightly bonded to a polyimide layer comprises a multi-step cure of the polyimide layer carried out in combination with a palladium-catalyzed electroless deposition process. A solution of a polyamic acid compound that is the precursor for the desired polyimide resin in a vaporizable solvent is applied to a substrate and heated preferably to temperature below 250° C., to form a soft-cured polyimide film. The film is immersed in an aqueous palladium-tin colloidal suspension to deposit the colloidal particles thereon, which particles are then activated to form palladium nuclei dspersed on the surface. The soft-cured film is then heated, preferably above about 250° C., to vaporize residual solvent and form a hard-cured polyimide layer having the palladium nuclei dispersed on the surface. The hard-cured layer is immersed in an electroless metal plating solution, whereupon the palladium nuclei catalyze deposition of the metal to form a continuous plate. In one aspect of the method, the metal-clad layer is further heated between about 350° C. and 450° C. to final cure the polyimide. It is found that the plate of the coating formed by this multi-cure method strongly adheres to the polymer layer to permit extended deposition and thereby form a relatively thicker plate without catastrophic separation from the polymer.

4 Claims, No Drawings

POLYIMIDE COATING HAVING ELECTROLESS METAL PLATE

BACKGROUND OF THE INVENTION

This invention relates to a method for forming a coating composed of a polyimide layer having an electroless metal plate bonded thereto. More particularly, this invention relates to such method utilizing dispersed palladium nuclei deposited from a colloidal suspension to catalyze electroless deposition of the metal plate, which method includes a multi-step cure of the polyimide carried out at several stages of the electroless deposition process to improve seeding of the catalyst and enhance adhesion of the plate.

A typical substrate for a microelectronic component package comprises a copper plate applied to a polymeric dielectric layer and patterned to define the desired electrical leads. A convenient process for applying the copper plate is by electroless deposition. The polymer surface is sensitized by applying palladium-tin colloidal particles from an aqueous suspension. The particles are activated by treatment with fluoboric acid solution to dissociate the tin and produce catalytic palladium nuclei. The surface, seeded with the palladium nuclei, is treated with an aqueous alkaline solution containing a reducible cupric species and a reducing agent, typically formaldehyde. In the presence of the catalytic nuclei, the copper is reduced to deposit metallic copper onto the surface. The process is autocatalytic, so that the nascent copper metal catalyzes further deposition to produce a continuous plate. After an intitial flash of the copper is deposited electrolessly, additional copper may be electroplated onto the flash to form a product plate of the desired thickness.

Electroless copper deposition has been successfully developed for dielectric substrates formed of epoxy resin and the like. It is desired to produce a substrate formed of polyimide resin to take advantage of its low dielectric constant, high thermal stability and reduced moisture absorptivity. However, electroless copper plates deposited onto a fully cured polyimide layer by conventional processes suffer from poor adhesion. Common techniques for enhancing adhesion of an electroless plate on polyimide include physically or chemically etching to roughen the surface. Mechanical techniques that abrade the surface tend to be difficult to control to obtain uniform treatment. The most common technique for chemically etching utilizes caustic solution to attack the polyimide molecules and thus degrades the quality of the resin at the surface. In any event, even with such surface treatments, it has been possible to apply only a very thin layer of copper to polyimide before the plate separates from the surface due to the poor adhesion. Therefore, there remains a need to improve adhesion of electroless copper plate on polyimide resin to thereby permit a thicker plate to be applied without separation.

SUMMARY OF THE INVENTION

This invention contemplates an improved method for forming a metal-clad polyimide coating that utilizes a multistep cure of the polyimide resin carried out in combination with a palladium-catalyzed electroless deposition procedure to apply a metal plate that is tightly bonded to the polyimide layer. The electroless plate may be formed of metallic nickel or copper, with copper being preferred. The method of this invention allows the thickness of the electroless plate to be increased without resulting in separation from the polymer.

In a preferred embodiment, the method comprises applying to a substrate a solution composed of an imidizable polyamic acid compound dissolved in a vaporizable organic solvent. The solution is heated at a first temperature, preferably less than 250° C., to imidize the precursor to form the desired polyimide resin and vaporize the solvent. However, sufficient solvent is retained during this first curing stage to produce a soft-cured film. The resulting soft-cured film typically contains between about 5 and 15 weight percent solvent. The film is immersed in an aqueous suspension of tinpalladium colloidal particles, whereupon particles become attached to the surface. Thereafter, the particles on the surface are treated to dissociate the tin and produce palladium nuclei suitable for catalyzing electroless deposition. Following seeding of the surface with the nuclei, the soft-cured film is then further heated at a relatively higher temperature, preferably greater than about 250° C., to form a hard-cured layer. During this hard cure, it is believed that the palladium nuclei become embedded in the film surface to prevent the nuclei from being readily dislodged, while remaining effective to catalyze the desired reactions. Thereafter, the hard-cured layer is treated with an aqueous alkaline solution containing a reducible ionic copper species and a reducing agent, such as formaldehyde, whereupon the palladium nuclei catalyze reduction of the copper and thereby initiate deposition of copper metal onto the polyimide surface. Treatment is continued in the presence of the nascent copper to produce a continuous plate. Following plating, the polyimide layer may be subjected to a final, high temperature cure at above 350° C. The resulting coating features the copper plate tightly bonded to the fully cured polyimide coating, in marked contrast to similar copper plates applied to polyimide layers that are fully cured prior to catalyst seeding. In one aspect of this invention, the time of immersion in the electroless plating solution may be extended to increase the thickness of the plate that is deposited without catastrophic separation from the polymer layer.

DESCRIPTION OF A PREFERRED EMBODIMENT

In accordance with a preferred embodiment, the method of this invention is employed to produce a dual-layer coating on an alumina substrate that includes a first layer composed of a fully cured polyimide resin overlying the substrate and a continuous electroless copper plate bonded to the polyimide layer. The substrate was cleaned and treated with an aqueous solution containing 0.5 weight percent gamma-aminopropyltriethoxysilane to improve polymer adhesion. The solution was spun applied and dried at 110° C. for 10 minutes.

The substrate was coated with a thin film of a solution containing a polyamic acid compound that is the precursor for the desired polyimide resin. The particular polyamic acid precursor was the reaction product of sysmetrical-biphenyl tetracarboxylic dianhydride and 4,4'-oxydianiline. The solution containing about 15 weight percent polyamic acid compound dissolved in N-methyl-2 pyrrolidone (NMP) solvent was obtained commercially from the E.I. Dupont de Nemours & Company under the trade designation Pyralin PI-2611.

The solution was sprayed onto the substrate, gradually heated over a one hour period up to 100° C. and maintained at the temperature for one hour to produce an uniform film. Thereafter, the temperature was increased to about 200° C. and maintained for one hour to imidize the compound to form the desired polyimide resin. All heating was carried out while exposed to flowing nitrogen gas. The resulting soft-cured film contained about 11 weight percent volatile material, which material was predominantly NMP solvent, but also included water produced as a by-product of the imidization reaction in an amount believed to be less than 1 weight percent of the film.

In preparation for electroless copper deposition, the surface of the soft-cured film was seeded with catalytic palladium nuclei. The film was cleaned in a aqueous alkaline solution at 150° C. for about 5 minutes, rinsed and immersed for 2 minutes in an aqueous predip solution containing 25 volume percent hydrochloric acid at room temperature. The film was then immersed in an aqueous palladium-tin colloidal suspension. The suspension was prepared by adding about 3 volume percent of a commercially available concentrate comprising palladium chloride and stannous chloride to a 25 volume percent aqueous hydrochloric acid solution. The resulting mixture had a palladium concentration of about 0.15 gram per liter and also contained about 8.0 grams per liter stannous chloride. The soft-cured film was immersed in the suspension at ambient temperature for about 5 minutes. During this immersion, colloidal particles of palladium and tin attached to the polyimide surface, as evidenced by a change in the appearance of the film. Thereafter, the film was water rinsed and immersed in an ambient temperature aqueous solution containing about 15 volume percent fluoboric acid, $HBF_4$. Fluoboric acid dissociated tin from the colloid particles to expose the palladium catalyst. The palladium-seeded surface was water rinsed and spun dry.

Following seeding, the polyimide film was subjected to a second curing step. The film was dried while exposed to flowing nitrogen gas for one hour at 50° C. Thereafter, the temperature was slowly increased over about one hour to 290° C. and maintained at the temperature for about 2 hours. This higher temperature cure substantially removed the residual solvent and produced a hard-cured film believed to contain less than 2 weight percent volatile material.

The hard-cured film was immersed in a conventional electroless copper plating solution containing about 3 grams per liter copper ion, dissolved as copper sulfate, $CuSO_4$; about 9 grams per liter sodium hydroxide, NaOH; and about 7 grams per liter formaldehyde, HCHO; and also including lesser amounts of accelerating and chelating agents. A suitable solution was prepared from a commercially available concentrate marketed by Oxy Metal Industries under the trade designation Sel-Rex Circuitprep 5501. The film was immersed in the solution at ambient temperature for up to about 5 minutes. During this time, metallic copper was deposited onto the surface and produced a continuous plate that was tightly bonded to the substrate.

Following copper deposition, the polyimide layer was subjected to a final curing step. The copper-clad coating was water rinsed, and dried in flowing nitrogen gas for about one hour at 50° C. The temperature was slowly increased over a period of about one hour to about 350° C. and maintained for one hour, before cooling again to room temperature. The coated product featured a copper plate tightly bonded to a polyimide layer carried on the ceramic substrate.

For purposes of comparison, an experiment was carried out to attempt to deposit an electroless copper plate onto a layer formed of a similar polyimide that was fully cured prior to plating. A solution of the polyamic acid compound in the described embodiment was applied to an alumina substrate and cured by heating at a temperature of 350° C. The fully cured coating was treated to deposit copper using the solutions and conditions in the described embodiment, but without the intermediate curing steps in accordance with this invention. Thus, the cured layer was cleaned in alkaline solution, rinsed, neutralized with acid predip solution, rinsed, immersed in the palladium-tin collodial suspension, activated using the fluoboric acid solution, rinsed and immersed in the electroless copper plating solution. In the plating solution, a copper plate initially formed, but blistering occurred after about one minute, whereafter the plate quickly separated from the polyimide layer. This is in marked contrast to the tightly adherent plate that was deposited by the multi-step curing method of this invention even after up to 5 minutes in the solution. Since the amount of metal that is deposited is directly related to the time of immersion in the solution, the extended immersion time permitted by the method of this invention is suitable for forming a substantially thicker plate that facilitates subsequent processing, including electroplating, particularly as opposed to the meager flash that is deposited by conventional processes that apply the catalyst only after the polymer is fully cured.

The improved adhesion of the copper plate formed on the polyimide coating in accordance with this invention is in large part attributed to enhanced seeding of the catalyst nuclei onto the polyimide in a soft cure condition, as opposed to a hard cured or final cured condition. A series of tests were performed following the procedure in the described embodiment, but varying the soft cure temperature. The results are set forth in the Table. In a first series of tests, substrates were prepared with polyimide films soft cured at the designated temperature, seeded with palladium catalyst, hard cured by heating at 290° C. and immersed in electroless copper plating solution. While immersed in the solution, the substrates were visually inspected to determine the onset of formation of blisters, indicative of adhesive failure of the plate. For purpose of comparison, blistering of plate deposited onto fully cured polyimide film is observed after about one-half minute. Thus, the multi-step cure method of this invention inhibited blistering and substantially extended the plating time to permit a thicker deposit to be formed.

TABLE

| Soft Cure Temperature in °C. | Blister Formation in minutes | Sheet Resistance in Ohm/square | Pull Strength in Ksi |
|---|---|---|---|
| 170 | 3.0 | 0.26 | 5.5 |
| 200 | 5.0 | 0.16 | 10.0 |
| 225 | 3.5 | 0.28 | 8.5 |
| 250 | 2.5 | 0.42 | 7.5 |

In a second series of tests, samples were prepared having polyimide layers cured at the designated soft cure temperature, seeded with the palladium catalyst and immersed in the electroless copper plating solution for a time equal to one minute less than the time measured for the onset of blistering at the designated temperature. This produced samples having continuous plates bonded to the polyimide layers. The resistances of the resulting plates were measured using a four-point probe and reported in the Table. In general, sheet resistance is inversely proportional to plate thickness. For purposes of comparison, a similar sample was prepared but having a polyimide layer that is hard cured before catalyst seeding and immersed in the plating solution to deposit a plate having the maximum thickness before blistering and separation. The resistance of the plate was measured greater than 2.2 ohms per square. The substantially lower resistances obtained for plates formed in accordance with this invention further demonstrate the increased plate thickness attributed to the improved adhesion of the plate to the polymer.

Following the sheet resistance tests, the samples were subjected to a pull test to measure bond strength of the plate to the polymer layer. A stud was attached to the plate using an oven-cured epoxy adhesive and pulled in a direction normal to the substrate surface. The maximum force required for separation of the plate from the polymer was measured and reported in the Table. As can been seen, the pull strength was maximized for the sample soft cured at 200° C., corresponding to the optimum plating conditions reported for the blistering and sheet resistance tests.

While not limited to any particular theory, the dramatically improved adhesion of the plate to the polyimide layer obtained by the method of this invention is believed to be mainly attributed to improved seeding of the catalyst particles. The polyimide is formed from a polyamic acid precursor dissolved in a vaporizable solvent. Soft cure is carried out at a temperature sufficient to substantially imidize the precursor, which is also accompanied by vaporization of the solvent. However, in the method of this invention, it is believed that a significant amount of solvent, at least about 5 weight percent and preferably between about 5 and 15 weight percent based upon the weight of the soft-cured film, is retained. The presence of the solvent improves the hydrophilic properties of the film surface. This improves attachment of the colloidal particles to the surface, as is evidenced by a noticeable increase in the density of particles per area that cling to the surface when removed from the suspension. The high particle density increases the catalyst sites available for initiating electroless deposition, which reduces residual stress in the plate and contributes to the improved adhesion. Also, in the soft cure condition, the polyimide molecules have increased flexibility in orientation that is not found in the more ordered structure of the fully cured layer. Following application of the catalyst nuclei, the film is further cured at a relatively higher temperature to release the residual solvent, which may include water that is the by-product of the imidization reaction. Preferably, following hard curing, the layer contains less than 2 percent volatile components. Vaporization of the additional solvent promotes packing of the polyimide into a more rigid arrangement associated with the hard-cured condition. This in turn causes the nuclei to become embedded in the surface to anchor the initial copper deposit and thereby promote bonding of the nascent plate. The result is improved adhesion of the plate to the polyimide film to inhibit blistering and permit deposition of a thicker plate.

Accordingly, the method of this invention produces a copper-plated polyimide layer by a multi-step cure of the precursor solution carried out at various stages of the electroless plating process. Soft curing is suitably carried out at a temperature at least effective to complete imidization of the precursor, which generally occurs above about 160° C. for the precursor in the described embodiment. Further, it is found that plate adhesion is optimized by heating during soft cure to below about 250° C., and preferably below about 225° C. In general, a solvent is desired having a boiling point between 160° C. and 250° C., and preferably less than about 225° C. In addition to N-methyl-2-pyrrolidone, suitable solvents for polyamic acid compounds include dimethylacetimide, n,n'-dimethyl formimide, methyl cresol, and diglyme. Within the preferred temperature range, heating for times up to about 2 hours is generally believed to be effective to form the desired soft-cured film. Furthermore, it is found that hard curing at temperatures less than about 250° C. does not significantly improve plate adhesion, whereas above about 350° C. produces inconsistent plating, which is attributed to a tendency of the catalyst to become buried within the polymer layer. In general, optimum plate adhesion is obtained by a hard cure temperature between 275° C. and 300° C. for a time up to about two hours, although longer times are not believed to significantly reduce plate adhesion.

In the described embodiment, electroless plating was followed by a final cure preferably carried out between about 350° C. and 450° C. The final cure is believed to remove trace amounts of residual solvent and produce a dense polymer layer. Treatment at the elevated temperature may also reduce stress within the plate, thereby further enhancing adhesion.

While in the described embodiment, the soft-cured film was first cleaned with alkaline solution, followed by a neutralizing acidic dip, enhanced plate adhesion is obtained even in the absence of such cleaning. Further, although fluoboric acid is particularly effective for activating the palladium catalyst, the colloidal particles, once applied, may be treated by other conventional techniques suitable for dissociating the tin to produce the desired nuclei. Although dispersion of the nuclei is believed to be enhanced by forming the hard-cured layer after applying the nuclei, the individual nuclei are believed to act substantially similar in catalyzing electroless deposition to nuclei formed on other surfaces by colloidal dissociation. Accordingly, the nuclei may be employed with any suitable electroless plating solution to produce plate with enhanced adhesion. Thus, in addition to copper, the method of this invention may be readily adapted to apply a nickel plate by immersing the hard-cured polyimide layer carrying the palladium nuclei into a conventional bath comprising a reducible ionic nickel species and a suitable reducing agent.

While this invention has been described in terms of certain embodiments thereof, it is not intended that it be limited to the above description but rather only to the extent set forth in the claims that follow.

The embodiments of the invention in which an exclusive property or privilege is claimed are defined as follows:

We claim:

1. An electroless deposition method for forming a metal-clad polyimide coating comprising
   applying to a substrate a liquid film composed of an imidizable polyamic acid compound dissolved in a vaporizable solvent,
   heating the liquid film at a temperature and for a time effective to imidize the compound and vaporize the solvent to to form a soft-cured polyimide film comprising between about 5 and 15 weight percent solvent, contacting an exposed surface of the soft-cured film with an aqueous suspension of palladium-tin colloidal particles to deposit the particles onto the film surface, treating the deposited particles dissociate the tin and produce palladium nuclei dispersed on the surface, heating the soft-cured film at a temperature and for a time effective to vaporize the residual solvent to form a hard-cured polyimide layer, whereupon the palladium nuclei are dispersed on the surface of said hard-cured layer, and treating the nuclei-bearing hard-cured surface with an electroless deposition solution containing a reducible metallic species selected from the group consisting of copper ions and nickel ions, and a reducing agent suitable for reducing said species in the presence of palladium nuclei to a metal state, whereupon the palladium nuclei catalyze reduction of the species to initiate deposition of metal onto the surface, said treatment continuing for a time sufficient to form a continuous metal plate tightly bonded to the hard-cured polyimide layer.

2. A method for forming a coating composed of a polyimide layer having an electroless copper plate tightly bonded thereto, said method comprising applying to a substrate a solution composed of a polyamic acid compound dissolved in a vaporizable solvent, heating the solution at a temperature less than 250° C. to imidize the compound and vaporize the solvent to form a soft-cured polyimide film containing at least 5 weight percent vehicle, immersing an exposed surface of the soft-cured film in an aqueous suspension of palladium-tin colloidal particles to deposit the particles onto the surface, treating the deposited particles to dissociate the tin and produce palladium nuclei dispersed on the soft-cured film surface, heating the soft-cured film at a temperature greater than about 250° C. to form a hard-cured polyimide layer, whereupon the palladium nuclei are dispersed on the surface of said hard-cured layer, and immersing the palladium bearing hard-cured surface in an electroless copper deposition solution containing dissolved ionic copper species and formaldehyde under conditions suitable to cause the palladium nuclei to catalyze reduction of the species to initiate deposition of metallic copper onto the surface, said deposition continuing in the presence of said nascent copper for a time sufficient to form a continuous copper plate tightly bonded to the hard-cured polyimide layer.

3. A method for forming a copper-clad polyimide coating on a substrate, said method comprising applying to the substrate a solution composed of a polyamic acid compound dissolved in a vaporizable organic solvent, heating the solution at a temperature between about 175° C. and 225° C. for a time not greater than about 2 hours to form a soft-cured polyimide film, immersing the soft-cured film in an aqueous suspension of palladium-tin colloidal particles to deposit the particles onto the film, treating the deposited particles to dissociate the tin and produce palladium nuclei dispersed on the soft-cured film, heating the soft-cured film at a temperature between about 250° C. and 350° C. for a time not greater than about 2 hours to form a hard-cured polyimide layer, whereupon the palladium nuclei are dispersed on said hard-cured layer, electrolessly depositing copper metal onto the palladium-bearing hard-cured layer by immersing the layer in an aqueous alkaline solution containing a dissolved cuprous species and formaldehyde, whereupon the palladium nuclei catalyze reduction of the species by the formaldehyde to initiate deposition, and continuing said deposition in the presence of said nascent copper for a time sufficient to form a continuous copper plate, and heating the copper-plated hard-cured polyimide layer above 350° C. to finish curing the polyimide and thereby produce a laminate comprising a fully cured polyimide layer having a continuous copper plate tightly bonded thereto.

4. A method for forming a copper-clad polyimide layer on a substrate, said method comprising applying to the substrate a solution composed of a polyamic acid compound dissolved in a vaporizable vehicle composed predominantly of N-methyl-2-pyrrolidone compound, heating the solution at a temperature between about 175° C. and 225° C. for a time not greater than about 2 hours to form a soft-cured polyimide film, immersing the soft-cured film in an aqueous suspension of palladium-tin colloidal particles to deposit the particles onto an exposed surface of the film, treating the deposited particles to dissociate the tin and produce palladium nuclei dispersed on the soft-cured film, heating the soft-cured film at a temperature between about 275° C. and 300° C. for a time not greater than about 2 hours to form a hard-cured polyimide layer, whereupon the palladium nuclei are dispersed on the surface of said hard-cured layer, immersing the palladium-bearing surface of said hard-cured coating in a solution containing dissolved copper ions and formaldehyde, whereupon the palladium nuclei are effective to catalyze reduction of the copper in the presence of the formaldehyde to initiate deposition of metallic copper onto the surface, said deposition continuing in the presence of said nascent copper for a time sufficient to form a continuous copper plate, and heating the copper-plated hard-cured polyimide layer at a temperature between about 350° C. and 450° C. to final cure the polyimide layer and thereby produce a fully cured polyimide layer having a continuous copper plate tightly bonded thereto.

* * * * *